(12) United States Patent
Kelberlau

(10) Patent No.: US 7,262,467 B2
(45) Date of Patent: Aug. 28, 2007

(54) OVER CHARGE PROTECTION DEVICE

(75) Inventor: Ulrich Kelberlau, Lampertheim (DE)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 10/930,276

(22) Filed: Aug. 30, 2004

(65) Prior Publication Data

US 2005/0051862 A1    Mar. 10, 2005

Related U.S. Application Data

(60) Provisional application No. 60/501,963, filed on Sep. 10, 2003.

(51) Int. Cl.
*H01L 23/60* (2006.01)

(52) U.S. Cl. .................. 257/355; 257/656; 257/657

(58) Field of Classification Search .............. 257/355, 257/656, 657
See application file for complete search history.

(56) References Cited

U.S. PATENT DOCUMENTS

| | | | |
|---|---|---|---|
| 4,982,260 A | 1/1991 | Chang et al. | |
| 5,086,330 A | 2/1992 | Minato | |
| 5,500,377 A | 3/1996 | Flores et al. | |
| 5,682,044 A | 10/1997 | Tamamushi et al. | |
| 5,880,513 A | 3/1999 | Temple et al. | |
| 6,670,776 B2 | 12/2003 | Guthrio et al. | |
| 6,728,275 B2 | 4/2004 | Stephens, IV et al. | |

*Primary Examiner*—Gene M. Munson
(74) *Attorney, Agent, or Firm*—Townsend and Townsend and Crew LLP

(57) ABSTRACT

An over-voltage protection device includes a substrate including an upper surface and a lower surface; a first electrode provided on the upper surface of the substrate; a second electrode provided on the lower surface on the substrate; a first conductive layer overlying the lower surface of the substrate, the first conductive region being a conductive region of a first type; a plurality of first conductive regions provided proximate the upper surface of the substrate, the plurality of first conductive regions being conductive regions of the first type; and a plurality of second conductive region provided proximate the upper surface of the substrate, the plurality of second conductive region being conductive regions of a second type. The plurality of the first conductive regions are provided in an alternating manner with the plurality of second conductive regions. The first electrode is contacting the plurality of the first and second conductive regions.

11 Claims, 3 Drawing Sheets

OVER CHARGE PROTECTION DEVICE

CROSS-REFERENCES TO RELATED APPLICATIONS

The present application claims priority to U.S. Provisional Patent Application No. 60/501,963, filed on Sep. 10, 2003, which is incorporated by reference.

BACKGROUND OF THE INVENTION

The present invention relates to a semiconductor power device, more specifically, a an over-charge protection device.

In some applications for laser-diodes (e.g. welding) high laser power is necessary. This is achieved by electrically connecting many laser-diodes (e.g., 10 or more) in series, a solution that requires one power source or current source.

With series connection, one requires more acceptable, readily available voltage range for driving these laser diodes in series, 10 volts or more, rather than the low voltage, 1 volt to 3 volts that one such diode will need. The same argument holds for the series connection of light emitting diodes, (LED's), for lighting applications.

Another advantage of a series connection is higher power output compared to higher current in a parallel connection. For same power output in a parallel connection, the current is higher. For example, for 10 diodes in parallel, the current is 10 times higher than in a series connection, thus the conduction losses in the associated conductors are 100 times higher (power loss increases by the square law of current). A problem arises, however, when one of the laser-diodes, (or LED's) in a series-connection fails and is destroyed. This may make the entire device unusable although other nine diodes are in good operational condition.

BRIEF SUMMARY OF THE INVENTION

The present invention relates to an overvoltage protection device that has the characteristics of a diode and resistor. The overvoltage protection device is accordingly referred to as "diristor."

In one embodiment, the diristor includes a substrate of first conductivity, a layer of second conductivity, a plurality of conductive wells of first type formed proximate an upper surface of the diristor, and a plurality of conductive wells of second type formed proximate the upper surface of the diristor. The conductive well of first type and conductive well of second type are placed in alternating order.

In one embodiment, an over-voltage protection device includes a substrate including an upper surface and a lower surface; a first electrode provided on the upper surface of the substrate; a second electrode provided on the lower surface on the substrate; a first conductive layer overlying the lower surface of the substrate, the first conductive region being a conductive region of a first type; a plurality of first conductive regions provided proximate the upper surface of the substrate, the plurality of first conductive regions being conductive regions of the first type; and a plurality of second conductive region provided proximate the upper surface of the substrate, the plurality of second conductive region being conductive regions of a second type. The plurality of the first conductive regions are provided in an alternating manner with the plurality of second conductive regions. The first electrode is contacting the plurality of the first and second conductive regions.

In another embodiment, a laser diode module includes a laser diode; an over-voltage protection device in parallel connection to the laser diode; and an electrical contact coupled to both the laser diode and the over-voltage protection device. The over-voltage protection device includes a substrate including an upper surface and a lower surface; a first electrode provided on the upper surface of the substrate; a second electrode provided on the lower surface on the substrate; a first conductive layer overlying the lower surface of the substrate, the first conductive region being a conductive region of a first type; a plurality of first conductive regions provided proximate the upper surface of the substrate, the plurality of first conductive regions being conductive regions of the first type; and a plurality of second conductive region provided proximate the upper surface of the substrate, the plurality of second conductive region being conductive regions of a second type. The plurality of the first conductive regions are provided in an alternating manner with the plurality of second conductive regions. The first electrode is contacting the plurality of the first and second conductive regions.

In yet another embodiment, a semiconductor device to provide over-voltage protection includes a substrate including an upper surface and a lower surface; a first electrode provided on the upper surface of the substrate; a second electrode provided on the lower surface on the substrate; a first conductive layer overlying the lower surface of the substrate, the first conductive region being a conductive region of n+ type; a second conductive layer the first conductive layer, the second conductive layer being a conductive region of n+ type; a plurality of first conductive regions provided proximate the upper surface of the substrate, the plurality of first conductive regions being conductive regions of n+ type; and a plurality of second conductive region provided proximate the upper surface of the substrate, the plurality of second conductive region being conductive regions of p+ type. The plurality of the first conductive regions are provided in an alternating manner with the plurality of second conductive regions. The first electrode is contacting the plurality of the first and second conductive regions.

DETAILED DESCRIPTION OF THE INVENTION

For illustrative purposes, the over-voltage protection device or diristor of the present invention is described in connection with laser diodes. The diristor, however, may be applied to other types of power devices or diodes.

In series-connected laser diodes, if one of them is short-circuited, the current continues to flow through the remaining laser-diodes so that they continue to operate. In many cases, however, a failed laser-diode causes an interruption of the current flow because of a high resistance or disconnected (molten) leads. An interruption of the current flow through one of the laser-diodes then causes the whole stack of series connected devices to stop functioning.

One embodiment of the present invention provides an over-voltage protection device that can be connected in parallel to a laser-diode (or any other device with similar characteristics). Under normal operating condition, the current flow through the laser-diode causes a voltage drop of typically 1V–3V. In this case the current flowing through the over-voltage protection device should be as small as possible.

Any increase of the voltage drop across the laser-diode above a given potential, e.g., above 2V–3V, indicates a failure of the device. In this case, the parallel-connected protection device (or diristor) is turned on and conducts the current with a low voltage drop, which preferably is the same as the normal voltage drop of a functioning laser-diode. A semiconductor device described below has one or more of the above features.

Figure 1A:
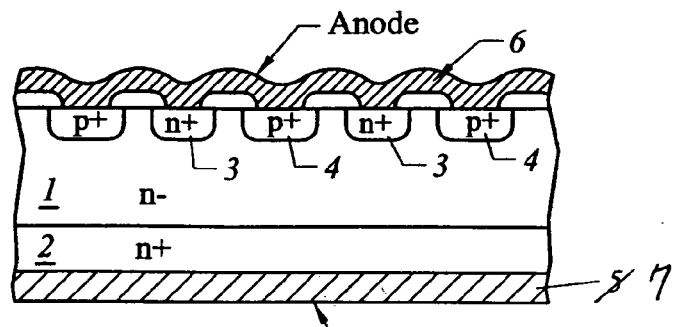
FIGS. 1A and 1B illustrate cross-sectional views of over-charge protection devices according to embodiments of the present invention.

In FIG. 1A, a device or diristor includes a silicon substrate or chip with an n– region 1 (or a first conductive region of first conductive type) having a low doping concentration and an n+ region 2 (or a second conductive region of first conductive type) with a high n+ type doping concentration. The n+ region is formed over the bottom surface, and the n– region is formed on the n+ region. The top surface is patterned with alternating n+ regions 3 (or. a third conductive region of first conductive type) and p+ regions 4 (or a fourth conductive type of second conductive type). The bottom surface is covered with a metal layer 7 forming the cathode contact, and the top surface is covered with a metal layer 6 forming the anode contact. The anode is in contact with both n+ and p+ regions 3 and 4.

Figure 1B:
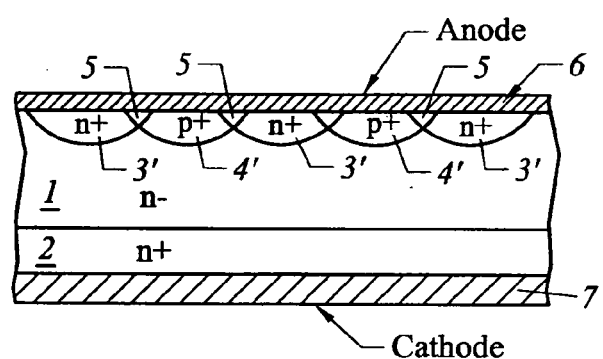

FIG. 1B illustrates a diristor having n+ regions 3' and p+ regions 4' contacting each other in alternating manner. A region 5 illustrates a diffused region that includes dopants from both the n+ region and p+ region.

Figure 4A:
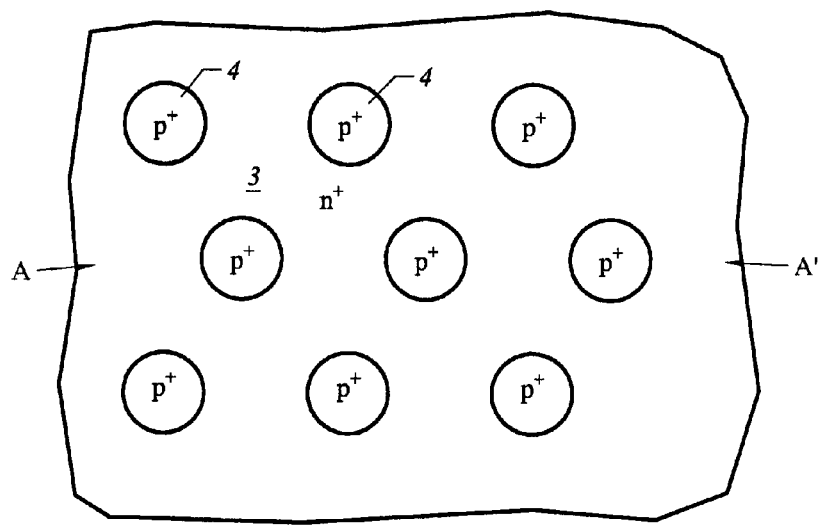
FIG. 4A illustrates a top view of an over-charge protection device of one embodiment of the present invention.
Figure 4B:
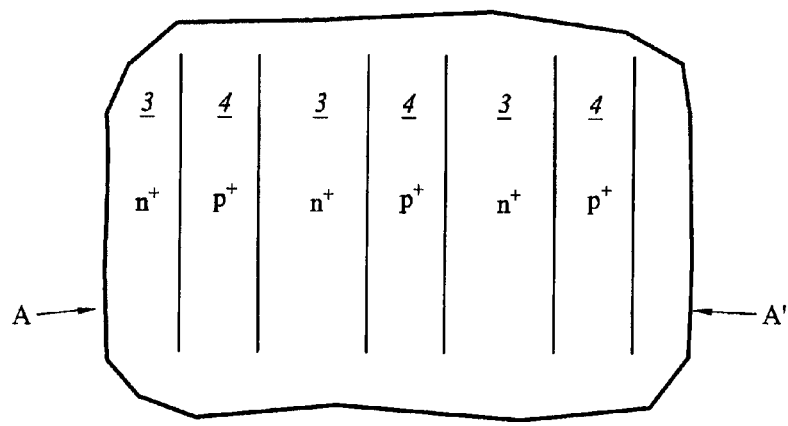
FIG. 4B illustrates an over-charge protection device of another embodiment of the present invention.

FIGS. 4A and 4B illustrates top views of diristors according to embodiments of the present invention. The pattern of n+ and p+ regions 3 and 4 can be for example p+ islands that are surrounded by an n+ area (see FIG. 4A), or n+ islands that are surrounded by a p+ area, or alternating stripes of different conductivity type (see FIG. 4B). FIG. 1B is a cross-sectional view of the device taken along arrows A and A' in FIG. 4A or 4B.

When a small positive voltage is applied to the anode contact to provide forward bias, an electron-current flows from n+ regions 3 to n+ region 2 via n– region 1. Under such a condition, the diristor behaves like an ohmic resistor. The current increases approximately linearly with the applied voltage. The value of the resistance is determined by the specific resistivity and thickness of the n– region 1, as well as by the size and geometry of the n+ regions 3 and the total area of the chip. In order to obtain a desirable low current in this mode of operation, the specific resistivity of n– region 1 can be chosen high, (higher than 5 ohm-cm), for example 70 ohm cm. The current is kept low during this state to minimize the current from being drained away from the laser diode to which the diristor is in parallel connection.

The current flowing from n+-regions 3 through the n– region 1 is spread laterally under the p+ regions 4 and thereby causes a lateral voltage drop. If the current exceeds a certain limit, this lateral voltage drop causes a forward bias on the pn-junction between regions 4 and 1, so that holes are injected from p+ regions 4 into the n– region 1. A resulting hole-current increases the carrier concentration in the n– region 1, so that the voltage drop between the anode and cathode decreases.

As a result, the diristor has the current-voltage characteristics of a resistor with small currents increasing linearly at low forward voltages (i.e., below a given threshold voltage), and the low voltage drop of a forward-biased diode once the applied voltage has exceeded the given voltage (see FIG. 2).

Figure 2:
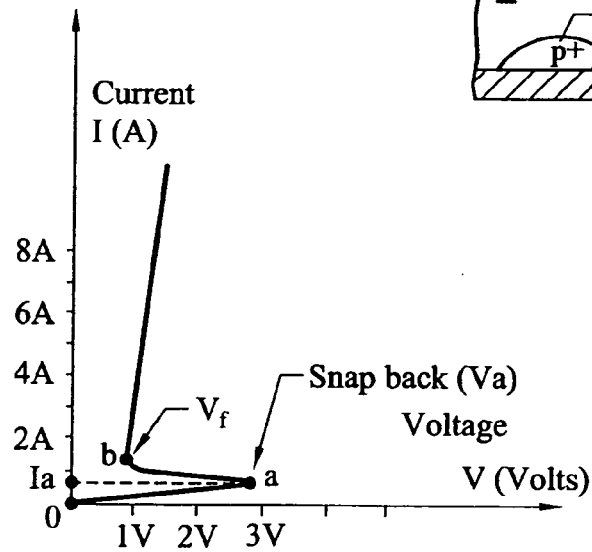
FIG. 2 illustrates a graph a current characteristic of an over-charge protection device of one embodiment of the present invention.

In FIG. 2, the diristor functions like a resistor as the voltage drop increases to a snapback voltage Va, e.g., 3 volts. Once the applied voltage has exceeded the snapback voltage Va at point "a", the current can be increased to very high levels with a small voltage drop between the anode and cathode, like a diode with a conduction voltage Vf as shown as point "b". The snapback voltage is the threshold voltage at which point the diristor converts its characteristics from a resistor-like behavior to a diode-like behavior.

The characteristics of the diristor can be tailored to provide a desired snapback voltage Va and conduction voltage Vf based on process and design parameters. Exemplary process/design parameters are illustrated below: (i) a structure like in FIG. 1A or 1B can be used, where the n+ region 3 is separated from the p+ region 4, with equal separation across the die, or varied separation distance across the die; (ii) the depth of the n+ region 3 can be equal or different than the depth of the p+ region 4; (iii) the relative size, in surface area and volume of the n+ region 3 can be equal or different than the size of the p+ region 4; (iv) the doping concentration of the n+ region 3 can be equal or different from the doping of the p+ region 4.

In one embodiment, some of the interesting performance parameters of the diristors are the current level at which it snaps back Ia, as shown in FIG. 2, and the snapback voltage Va. As explained above, the characteristics show a resistor type behavior, in voltage from 0 volts to Va. The value of the resistance (Va/Ia) is dependant on the resistivity of the n– region 1, and also by the relative area of the n+region 3 (also n+ regions 13 and 23 in FIG. 3). The doping or carrier concentration in the n+ regions also affect the resistance. The voltage of snapback Va is affected by the geometrical parameters of the corresponding p+ regions 4 (also p+ regions 14 and 24 in FIG. 3). The doping or carrier concentration in the p+ regions affect the Va. For example, the snapback voltage may be decreased by increasing the size of the p+ region 4 or increasing the resistivity of the n– region 1. The diristor characteristic's reverts back to resembling a resistor if the current flow is reduced below the current level "b".

By practicing the variations described above, the snapback voltage Va in the range of 1–3 volts can be produced with a snapback current Ia of 1 miliamperes to 1 ampere. For other applications, it is possible to provide a diristor having a higher snapback Va than the 3' volts and a higher snapback current than 1 ampere.

When the polarity of the applied voltage is reversed (negative on the anode), an electron-current flows from n+ region 2 to n+ regions 3. Again the device behaves like an ohmic resistor with the same value of the resistance. However, with this polarity of voltage the lateral current flow under the p+ regions 4 causes a reverse bias on the pn-junction between regions 4 and 1 so that no hole-current can be injected from p+ regions 4 into the n− region 1. Consequently, with negative anode-voltage the current through the diristor increases linearly without the snapback characteristic illustrated in FIG. 2.

Figure 3:
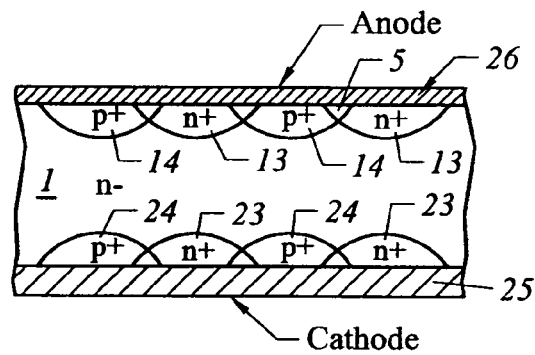
FIG. 3 illustrates a cross-sectional view of an over-charge protection device of one embodiment of the present invention.

FIG. 3 illustrates a diristor that provides over-voltage protection for both positive and negative polarities of applied voltage. The top surfaces are patterned with alternating n+ regions 13 and p+ regions 14, and the bottom surfaces are patterned with alternating n+ regions 23 and p+ regions 24. That is, FIG. 3 illustrates a double-sided diristor according to one embodiment of the present invention.

One can vary the sizes of the n+ and p+ region on the back side of the diristor, such that the n+ region 13 on the top is equal or different than the n+ region 23. Similarly, the size of the p+ region 14 on the top may be varied relative to the p+ region 24 on the backside. The n+ region 13 on the top can also be aligned vertically above the n+ region 23 on the bottom. or for different performance align vertically above the p+ region 24 on the bottom.

For different characteristics, the double-sided diristor can have the top side structure of the n+ and p+ regions look like the top side of the diristor in FIG. 1A (i.e., like the n+ and p+ regions 3 and 4), and the backside look like the top structure of the diristor in FIG. 1B (i.e., like the n+ and p+ regions 3' and 4'), and vice versa, thereby creating a non-symmetrical diristor. Such a diristor provides non-symmetrical performance characteristics for forward bias and negative bias.

Figure 5:
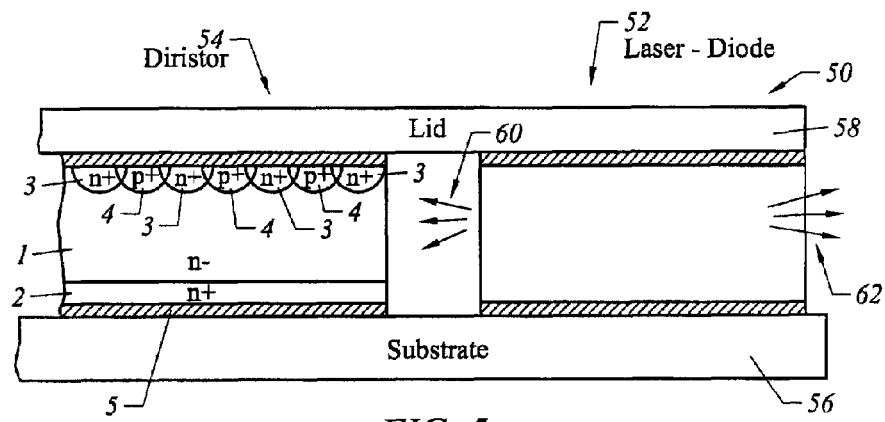
FIG. 5 illustrates a cross-sectional view of a laser diode module.

FIG. 5 illustrates a laser diode module 50 having a laser diode 52 and a diristor 54 provided in parallel connection. The laser diode 52 and diristor 54 are provided on the same substrate (heat sink) 56 next to each other with a small distance provided therebetween. The substrate 56 may be a copper heatsink, which also serves as electrical connection. A lid 58 couples both the diode and diristor on the top.

The laser diode emits radiation to along a given direction. The back side of a laser diode is usually covered with a mirror (not shown), which reflects the radiation and direct it to the front side of the laser diode. However, the mirror does not perfectly reflect the light or radiation to the front side and part of the radiation (as indicated by numerals 60 and 62) may be emitted towards the sides of the laser diode, including the side where the diristor is provided. Part of the light 60 can penetrate the outer surface of the diristor at the edge of the die that is adjacent to the back side of the laser. The light is then absorbed inside the diristor and creates electron-hole pairs.

These unintended electron-hole pairs may lower the predefined snapback voltage Va. That is, the effective snapback voltage may be less than the predefined snapback voltage Va due to the increased carriers in the diristor due to the electron-hole pairs generated by the light 60 from the laser diode. Similarly, the snapback current Ia may also be lowered.

As a result, the diristor may switch its characteristics from a resistor to a diode at an effective snapback voltage that is too low. In such a case, the diristor would take over the current from the laser diode although the laser diode is functioning normally.

Figure 6:
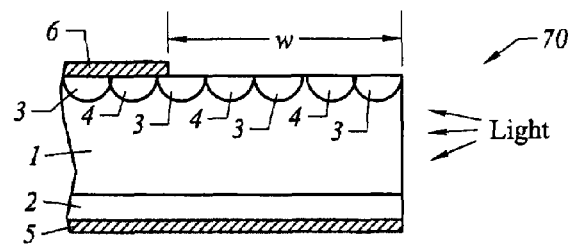
FIG. 6 illustrates an over-charge protection device configured to be less sensitive to an adjacent light source according to one embodiment of the present invention.

FIG. 6 illustrates a diristor 70 that is configured to be less sensitive to the light 60 received from the adjacent device (e.g., laser diode) according to one embodiment of the present invention. The active area of the diristor, which is in contact with the anode 6, is spaced apart from an edge of the die or diristor. For example, a distance w is provided between the edge of the die and the anode. This distance w is larger than the diffusion length of holes in the n− region 1. That is, these holes generated by the light are recombined before they travel beyond the distance w. In one embodiment, the distance w is 1, 2 or 3-times the vertical thickness of the n− layer 1.

Generally, light that penetrates a silicon surface, such as a diristor, is absorbed within a certain depth inside the silicon. For light with a wavelength of 800 nm, for example, the absorption length—defined as the length where the intensity drops by a factor of $1/e=0.368$—is approximately 10 μm. The majority of the incident light is absorbed within 2 to 3 absorption lengths, equivalent to approximately 30 μm. The optically generated holes, however, can diffuse much deeper into the n− layer 1 before they recombine with electrons. The diffusion length—defined as the length where the hole concentration drops by a factor of $1/e=0.368$—can be for example 100 μm or even several 100 μm.

Figure 7:
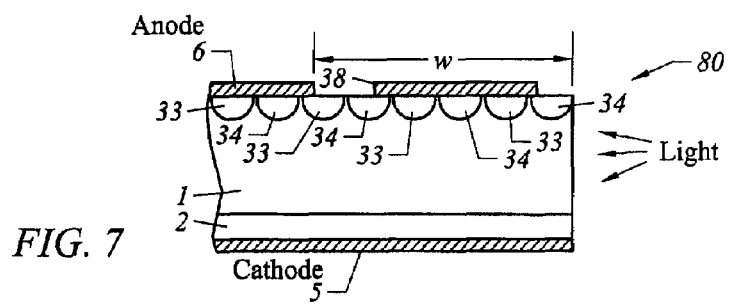
FIG. 7 illustrates an over-charge protection device configured to be less sensitive to an adjacent light source according to another embodiment of the present invention.

FIG. 7 illustrates a diristor 80 that is configured to be less sensitive to the light received from an adjacent device according to another embodiment of the present invention. The active area of the diristor that is in contact with the anode 6 is provided a distance w from the edge of the diristor as in FIG. 6. In addition, an area between the anode 6 and the edge of the die is at least partly covered with an electrode 38, which is electrically separated from the anode. The electrode 38 contacts n+ and p+ regions 33 and 34. The electrode 38 can be floating, i.e. not connected with the external circuit, or it can be connected to the cathode 5 through external circuitry (not shown).

The electrode 38 facilitates the recombination of the holes generated by the light 60 of the laser diode. That is, optically generated holes diffuses into the p+ regions 34, where they are attracted by the built-in electric field at the pn-junction. Similarly, the excess electrons flow into the n+ regions 33. The electrode contacts the n+ and p+ regions 33 and 34, so that electrons and holes can recombine through this contact.

The present invention has been illustrated using specific embodiments. The embodiments illustrated above may be amended, modified, or altered without departing from the scope of the present invention. For example, the structures provided for the diristors 70 and 80 may be provided on the top and bottom surfaces of a double-sided diristor. The scope of the present invention shall be determined based on appended claims.

What is claimed is:

1. An over-voltage protection device, comprising:
   a substrate including an upper surface and a lower surface;
   a first electrode provided on the upper surface of the substrate;
   a second electrode provided on the lower surface on the substrate;
   a first conductive layer overlying the lower surface of the substrate, the first conductive layer being a conductive layer of a first type;
   a second conductive layer provided over the first conductive layer, the second conductive layer having a higher resistivity than the first conductive layer;
   a plurality of first conductive regions provided proximate the upper surface of the substrate, the plurality of first conductive regions being conductive regions of the first type; and
   a plurality of second conductive regions provided proximate the upper surface of the substrate, the plurality of second conductive regions being conductive regions of a second type, the second conductive regions being configured to provide a forward bias with the second conductive layer, wherein the plurality of the first conductive regions are provided in an alternating manner with the plurality of second conductive regions, wherein the first electrode is contacting the plurality of the first and second conductive regions, wherein the over-voltage protection device is configured to act as a resistor when the first electrode is applied with a voltage that is less than a snapback voltage and as a forward-biased diode if the voltage applied exceeds the snapback voltage, wherein the first electrode is provided a distance w from an edge of the substrate, the distance w being larger than a diffusion length of holes in the second conductive layer.

2. The device of claim 1, further comprising:
a third electrode provided between the edge of the substrate and the first electrode and on the upper surface of the substrate.

3. The device of claim 2, wherein the third electrode is a floating electrode.

4. The device of claim 2, wherein the third electrode is electrically coupled to the second electrode.

5. An over-voltage protection device, comprising:
a substrate including an upper surface and a lower surface;
a first electrode provided on the upper surface of the substrate;
a second electrode provided on the lower surface on the substrate;
a first conductive layer overlying the lower surface of the substrate, the first conductive layer being a conductive layer of a first type;
a second conductive layer provided over the first conductive layer, the second conductive layer having a higher resistivity than the first conductive layer;
a plurality of first conductive regions provided proximate the upper surface of the substrate, the plurality of first conductive regions being conductive regions of the first type; and
a plurality of second conductive regions provided proximate the upper surface of the substrate, the plurality of second conductive regions being conductive regions of a second type, the second conductive regions being configured to provide a forward bias with the second conductive layer,
a plurality of third conductive regions provided proximate the lower surface of the substrate, the plurality of third conductive regions being conductive regions of the first type; and
a plurality of fourth conductive regions provided proximate the lower surface of the substrate, the plurality of fourth conductive regions being conductive regions of the second type,
wherein the plurality of the first conductive regions are provided in an alternating manner with the plurality of second conductive regions,
wherein the first electrode is contacting the plurality of the first and second conductive regions,
wherein the over-voltage protection device is configured to act as a resistor when the first electrode is applied with a voltage that is less than a snapback voltage and as a forward-biased diode if the voltage applied exceeds the snapback voltage, wherein the third and fourth conductive regions are arranged in an alternating manner.

6. A laser diode module, comprising:
a laser diode;
an over-voltage protection device in parallel connection to the laser diode, the over-voltage protection device including:
a substrate including an upper surface and a lower surface,
a first electrode provided on the upper surface of the substrate,
a second electrode provided on the lower surface on the substrate,
a first conductive layer overlying the lower surface of the substrate, the first conductive layer being a conductive layer of a first type,
a plurality of first conductive regions provided proximate the upper surface of the substrate, the plurality of first conductive regions being conductive regions of the first type, and
a plurality of second conductive region provided proximate the upper surface of the substrate, the plurality of second conductive region being conductive regions of a second type, wherein the plurality of the first conductive regions are provided in an alternating manner with the plurality of second conductive regions, wherein the first electrode is contacting the plurality of the first and second conductive regions; and
an electrical contact coupled to both the laser diode and the over-voltage protection device.

7. The module of claim 6, wherein the over-voltage protection device further comprises:
a second conductive layer provided over the first conductive layer, wherein the first conductive layer is n+ layer and the second conductive layer is n− layer.

8. The device of claim 7, wherein the plurality of the first conductive regions are n+ regions and the plurality of the second conductive regions are p+ regions.

9. A semiconductor device to provide over-voltage protection, the device comprising:
a substrate including an upper surface and a lower surface;
a first electrode provided on the upper surface of the substrate;
a second electrode provided on the lower surface on the substrate;
a first conductive layer overlying the lower surface of the substrate, the first conductive layer being a conductive layer of n+ type;
a second conductive layer overlying the first conductive layer, the second conductive layer being a conductive layer of n− type;
a plurality of first conductive regions provided proximate the upper surface of the substrate, the plurality of first conductive regions being conductive regions of n+ type; and
a plurality of second conductive region provided proximate the upper surface of the substrate, the plurality of second conductive region being conductive regions of p+ type,
wherein the plurality of the first conductive regions are provided in an alternating manner with the plurality of second conductive regions, wherein the first electrode is contacting the plurality of the first and second conductive regions, and wherein the first electrode is provided a distance w from an edge of the substrate.

10. The device of claim 9, wherein the distance w is longer than a diffusion length of holes in the second conductive layer.

11. The device of claim 10, further comprising:

a third electrode provided between the edge of the substrate and the first electrode and on the upper surface of the substrate.

* * * * *